(12) United States Patent
King et al.

(10) Patent No.: US 11,615,356 B2
(45) Date of Patent: Mar. 28, 2023

(54) LABOR TRACKING BEACON FOR VISUALIZING PROJECT STATUS IN COMPUTER-AIDED DESIGN

(71) Applicant: Applied Software Technology, Inc., Atlanta, GA (US)

(72) Inventors: Steve King, Atlanta, GA (US); Chris Arrowood, Atlanta, GA (US)

(73) Assignee: EVOLVE MEP, LLC, Atlanta, GA (US)

( * ) Notice: Subject to any disclaimer, the term of this patent is extended or adjusted under 35 U.S.C. 154(b) by 0 days.

(21) Appl. No.: 17/395,274

(22) Filed: Aug. 5, 2021

(65) Prior Publication Data

US 2022/0261723 A1 Aug. 18, 2022

Related U.S. Application Data

(60) Provisional application No. 63/149,275, filed on Feb. 13, 2021.

(51) Int. Cl.
*G06Q 10/00* (2012.01)
*G06Q 10/0631* (2023.01)
*G06F 30/13* (2020.01)

(52) U.S. Cl.
CPC ....... *G06Q 10/06313* (2013.01); *G06F 30/13* (2020.01)

(58) Field of Classification Search
None
See application file for complete search history.

(56) References Cited

U.S. PATENT DOCUMENTS

| | | | |
|---|---|---|---|
| 8,683,368 B2 * | 3/2014 | Smith | G06F 3/04817 715/772 |
| 9,070,216 B2 * | 6/2015 | Golparvar-Fard | G06T 19/006 |
| 11,106,842 B2 * | 8/2021 | Segev | G06F 30/20 |
| 2006/0044307 A1 * | 3/2006 | Song | G06T 11/206 345/419 |
| 2007/0046649 A1 * | 3/2007 | Reiner | G16H 30/20 345/173 |

(Continued)

OTHER PUBLICATIONS

Greenberg, Saul, and Chester Fitchett. "Phidgets: easy development of physical interfaces through physical widgets." Proceedings of the 14th annual ACM symposium on User interface software and technology. 2001. (Year: 2001).*

(Continued)

*Primary Examiner* — Gurkanwaljit Singh
(74) *Attorney, Agent, or Firm* — Clayton, McKay & Bailey, PC (57) ABSTRACT

Systems and methods presented herein provide project efficiency tracking based on comparing estimated material items and quantities from a design in a computer-aided design ("CAD") application to the actual purchased material items and quantities. A beacon symbol can be placed on a project drawing and include a progress ring, a materials status, work package number, and a percentage complete. The materials status can illustrate the percentage of budgeted materials that have been delivered. The progress ring can illustrate the job completion percentage. In one example, the progress ring can illustrate the percentage of budgeted labor hours that have been performed.

20 Claims, 5 Drawing Sheets

(56) References Cited

U.S. PATENT DOCUMENTS

| | | | | |
|---|---|---|---|---|
| 2010/0122201 | A1* | 5/2010 | Smith | G06F 3/04817 |
| | | | | 715/772 |
| 2012/0209743 | A1* | 8/2012 | Mesaros | G06Q 30/06 |
| | | | | 705/26.1 |
| 2013/0155058 | A1* | 6/2013 | Golparvar-Fard | |
| | | | | G06Q 10/06311 |
| | | | | 345/419 |
| 2014/0143747 | A1* | 5/2014 | Wang | G06F 30/394 |
| | | | | 716/129 |
| 2014/0222209 | A1* | 8/2014 | Radjy | G05B 19/406 |
| | | | | 700/265 |
| 2015/0193982 | A1* | 7/2015 | Mihelich | H04L 67/131 |
| | | | | 345/633 |
| 2016/0203430 | A1* | 7/2016 | Radjy | G06Q 10/06315 |
| | | | | 705/7.25 |
| 2021/0073449 | A1* | 3/2021 | Segev | G06N 5/025 |
| 2021/0233186 | A1* | 7/2021 | Cohen | G06Q 10/06316 |

OTHER PUBLICATIONS

Szekely, Pedro. "Template-based mapping of application data interactive displays." Proceedings of the 3rd annual ACM SIGGRAPH symposium on User interface software and technology. 1990. (Year: 1990).*

Maloney, John H., and Randall B. Smith. "Directness and liveness in the morphic user interface construction environment." Proceedings of the 8th annual ACM symposium on User interface and software technology. 1995. (Year: 1995).*

Lee, Namhun, and Eddy M Rojas. "Visual Representations for Monitoring Project Performance: Developing Novel Prototypes for Improved Communication." Journal of construction engineering and management 139.8 (2013): 994-1005. Web. (Year: 2013).*

Akram, Ramsha, et al. "Exploring the role of building information modeling in construction safety through science mapping." Safety Science 120 (2019): 456-470. (Year: 2019).*

Ghanem, A. (2007). Real-time construction project progress tracking: A hybrid model for wireless technologies selection, assessment, and implementation (Order No. 3282610). (Year: 2007).*

Dave, B. (2013). Developing a construction management system based on lean construction and building information modelling (Order No. 28801516). Available from ProQuest Dissertations and Theses Professional. (Year: 2013).*

Song, K. (2004). Project dashboard: Visual representation of project metrics on 3D building models (Order No. 3133365). Available from ProQuest Dissertations and Theses Professional. (Year: 2004).*

* cited by examiner

LABOR TRACKING BEACON FOR VISUALIZING PROJECT STATUS IN COMPUTER-AIDED DESIGN

CROSS-REFERENCE TO RELATED APPLICATION

This application claims the benefit of and priority to U.S. Provisional Application No. 63/149,275, filed on Feb. 13, 2021, titled "Labor Tracking Beacon for Visualizing Project Status in Computer-aided Design," the contents of which are hereby incorporated herein by reference in their entirety.

BACKGROUND

Computer-aided design ("CAD") software allows users to design structures for construction, among other things. One type of CAD software is Building Information Modeling ("BIM") software, which allows users to elaborately design three-dimensional structures. AUTODESK REVIT is one type of BIM software that can be used to design complex buildings all the way down to components and assemblies for use in a project. For example, a user can model an entire plumbing or electrical installation within a building.

BIM software often includes templates for construction materials and assemblies, such as conduit, plumbing, and air conditioning ducts, allowing the designer to design these elements into a building plan. REVIT templates for various components, such as plumbing or air conditioning ducts, can allow a user to place these components and easily visualize where the components will go.

However, the template conduit is for visualization purposes only, and is of limited use for fabrication. Different vendors can sell parts kits that may require assembly into one or more part assemblies shown in a drawing, such as a 2D or 3D CAD or BIM drawing. The parts, assembly, and pricing can vary depending on which vendor supplies which parts or assemblies included in the drawings. Additionally, the drawings do not necessarily include the detail required for assembly. As an example, a long conduit run of 50 feet would appear to be one long piece of conduit based on the generic REVIT template. But in the real world, this same run would be broken into multiple connected pieces of conduit for cost savings and transportation feasibility.

Because of this limitation on current CAD and BIM technology, much time is spent attempting to determine what parts are actually needed and what the cost will be, based on a CAD or BIM drawing. Each vendor typically must determine which assemblies can apply. It is often left to the builder or construction professional to stage ordering appropriately.

Additionally, once construction begins, it is difficult to know the progress of each area within the plan. Materials ship and may sit without being assembled on site for lengths of time. Construction labor budgets are based on estimated materials not the actual material that will be ordered and delivered to the project. Field labor hours are being tracked and reported against the estimated labor budget; however, the budget currently has no way of considering the actual labor value of the material items being ordered and subsequently installed. As a result, labor performance/efficiency cannot accurately be evaluated. Currently the progress and efficiencies of the actual construction is not tied to the original plan in REVIT in any meaningful way.

Therefore, a need exists for a system that can provide vendor-specific kits, staging, ordering logistics, and construction logistics based on a CAD or BIM drawing.

SUMMARY

The examples described herein specifically address technical problems and limitations of REVIT and similar BIM software. The examples include a server that can receive a drawing. A user can upload the drawing at an estimator graphical user interface ("GUI"), in an example. The GUI can be generated by the server in one example.

In an example, the server can receive information about a work breakdown structure ("WBS") related to the drawing. A WBS can be a deliverable-oriented breakdown of a project that integrates design, planning, installation scope of work, labor, materials, cost, and schedule baselines ensuring that project plans and teams are in alignment. The WBS can include a hierarchy of steps that break the project into levels, such as control accounts, planning packages, and work packages. Work packages can include activities or tasks required to produce a deliverable or complete a milestone. For example, a work package can include a scope of work description, assumptions, responsible individuals, milestones, durations, resources, location, budget (material cost and labor hours), material kits, percentage complete, actual labor hours and unproductive activities (waiting, rework).

In an example, the server can create a beacon symbol that graphically illustrates various aspects of a WBS work package shown in the drawing. As an example, the beacon symbol can display an identification ("ID") number for the work package, the status of materials delivered, the work progress, and reported labor hours. In one example, the beacon can include a progress circle graph that represents the status of materials delivered to the work package job site, the work package ID and a number representing the job completion percentage overlaying the materials status graph, and a progress doughnut graph encircling the materials status graph that represents the job progress ("progress ring"). In one example, the progress ring can represent reported labor hours as a percentage of the budgeted labor hours.

In an example, the server can overlay the beacon symbol on the project drawing in a GUI. The server can overlay multiple beacon symbols where multiple work packages are represented in the drawing. For example, a user can select or draw an area of the project drawing and indicate which work package it corresponds to. The server can position the beacon symbols on the project drawing according to their designated work package. The project drawing with the overlayed beacon symbol(s) can be accessible to users via a GUI provided by the server.

In one example, the materials status can be illustrated as a percentage of materials delivered compared to the materials budget. For example, the server can determine a materials budget based on the cost of the materials for the work package. The materials for a work package can be entered into the GUI manually by a user or determined by the server. For example, a specification filter ("spec filter") can analyze the drawing to determine common structures, such as electrical outlets or other assemblies. The spec filter can insert symbols into the drawing. In one example, the spec filter can do this automatically by recognizing nomenclature in the drawing. In another example, the user can identify a symbol in the drawing as a particular assembly, and the spec filter can identify like symbols as the same assembly type.

The symbols can represent assemblies associated with a vendor in an example. The spec filter can access data from a vendor database that identifies the relevant assemblies in one example. The spec filter can add a symbol layer to the drawing that contains metadata identifying each symbol. The metadata can allow the system to identify the correct vendor assemblies. In one example, the system adds the symbol layer by accessing BIM software, such as REVIT, via a plugin. The metadata can include information about the assemblies or kitting.

The GUI can display the drawing with a symbol overlay. The symbol overlay can visually indicate which elements are associated with which symbols (e.g., component types). The user can continue to change or assign symbols if any are not already fully allocated correctly by the spec filter. In one example, the symbol overlay is generated by a plugin that interfaces with a CAD program. Alternatively, it can be part of the spec filter or a stand-alone web application.

Next, the system can determine the kits that will be needed based on the metadata or symbols in the symbol layer. The server can then select the appropriate assembly kits based on information provided by the user to narrow the applicable kits. For example, the user can set up a profile for their project before or after scanning the drawing. The profile can indicate one or more applicable vendors. It can also indicate a building code jurisdiction, which can be associated with particular building codes that dictate part sizes, materials, and other relevant assembly attributes. Based on the profile information, the server can determine which kits apply to the various symbols in the drawing. This can be done by querying one or more vendor databases to determine the applicable kits based on the symbol layer metadata.

The GUI can present a bill of materials or purchase order that includes the staging information, in one example. The user can then select to purchase the kits, and the purchase order can be sent to the vendor for shipment. The system can then perform logistics related to the kit delivery. For example, based on certain types of assemblies requiring installation before others, the system can stage delivery over a period of time. The packages can also include custom tags and site-specific staging information based on the user-identified information. Appropriate orders can be generated by the system and sent automatically to each applicable vendor.

In an example, the system can verify the accuracy of the estimating material dollars and hours versus actual material purchased (dollars and hours). The system can evaluate and compare material estimates to actual purchased materials to determine the differences between estimated vs actual. This comparison can validate the estimate or shine a light on inaccuracies and defects. In one example, the server can update the beacon symbol based on this comparison. For example, the materials status graph on the beacon symbol can illustrate the percentage of materials budget that has been spent. If the amount spent exceeds the budget, the beacon symbol can display an alarm, such as by flashing, pulsing, or changing color.

The beacon symbol can alarm for other causes as well. For example, the beacon symbol can alarm when work progress is reported before all the materials have been delivered, when reported labor hours exceeds budgeted labor hours, when stoppages occur at the work site, and so on. Different portions of the beacon symbol can alarm depending on the alarm cause. For example, the materials status portion can alarm when an alarm event occurs relating to the materials, and the same can occur for a labor hours portion of the beacon symbol when a labor hours alarm event occurs.

In one example, a user can select a portion of the GUI to display more information about what the portion represents. For example, selecting the materials status portion can open a window that displays information about the materials for the work package, such as the materials needed, ordered, and delivered. In one example, the GUI can display markers when progress is stopped at the work site. Selecting one such marker can display information about the stoppage. In one example, selecting a portion of the beacon symbol that is alarming can display information about the alarm.

While a server example is explained, a web server is not required in all examples. Instead, the system can operate based on an application executing on a computing device operated by the user, in an example.

It is to be understood that both the foregoing general description and the following detailed description are exemplary and explanatory only and are not restrictive of the embodiments, as claimed.

BRIEF DESCRIPTION OF THE DRAWINGS

The accompanying drawings, which are incorporated in and constitute a part of this disclosure, illustrate various embodiments and aspects of the present invention. In the drawings.

DESCRIPTION OF THE EXAMPLES

Reference will now be made in detail to the present exemplary examples, including examples illustrated in the accompanying drawings. Wherever possible, the same reference numbers will be used throughout the drawings to refer to the same or like parts. The described examples are non-limiting.

In one example, a user logs into the system, such as at a web server. If no project exists, the user can create a new project. The user can enter information about the project, such as name, address, phone number, and other information. Then the user can select product list filters that specify user-identified criteria.

The user can pick an existing drawing file, such as a PDF, DWG, TIFF, or upload a new one. Then the user can use a viewer to identify elements in the drawing within a graphic overlay. For example, the user can select a visual element and then indicate a component type (e.g., assembly type). These can also be referred to as "smart points." These identified elements can then be further recognized by a spec filter, that can then assign the same component type to like elements. The spec filter can add symbols and/or metadata to the graphic overlay automatically based on the initial user selections. The system can then determine applicable components, assemblies, and kits based on the user-identified criteria. The system can present a bill of materials to the user for approval.

When the user places an order, the system can aggregate components, assemblies, and kits per vendor, and send orders to each vendor. A logistic component at the server can make sure the orders are staged correctly. For example, light fixtures can be ordered from a first vendor (i.e., supplier) and other components can be ordered from a second vendor. The orders can be staged based on user-identified criteria indicating projected build schedules.

The shipments can also be specially labelled based on the user-identified criteria. For example, bar codes, text, or RFID labels can be specified in advance by the user or be part of the stored user profile. Additionally, at the job site, the packaging can contain routing information for staging areas for the different kits.

Figure 1:
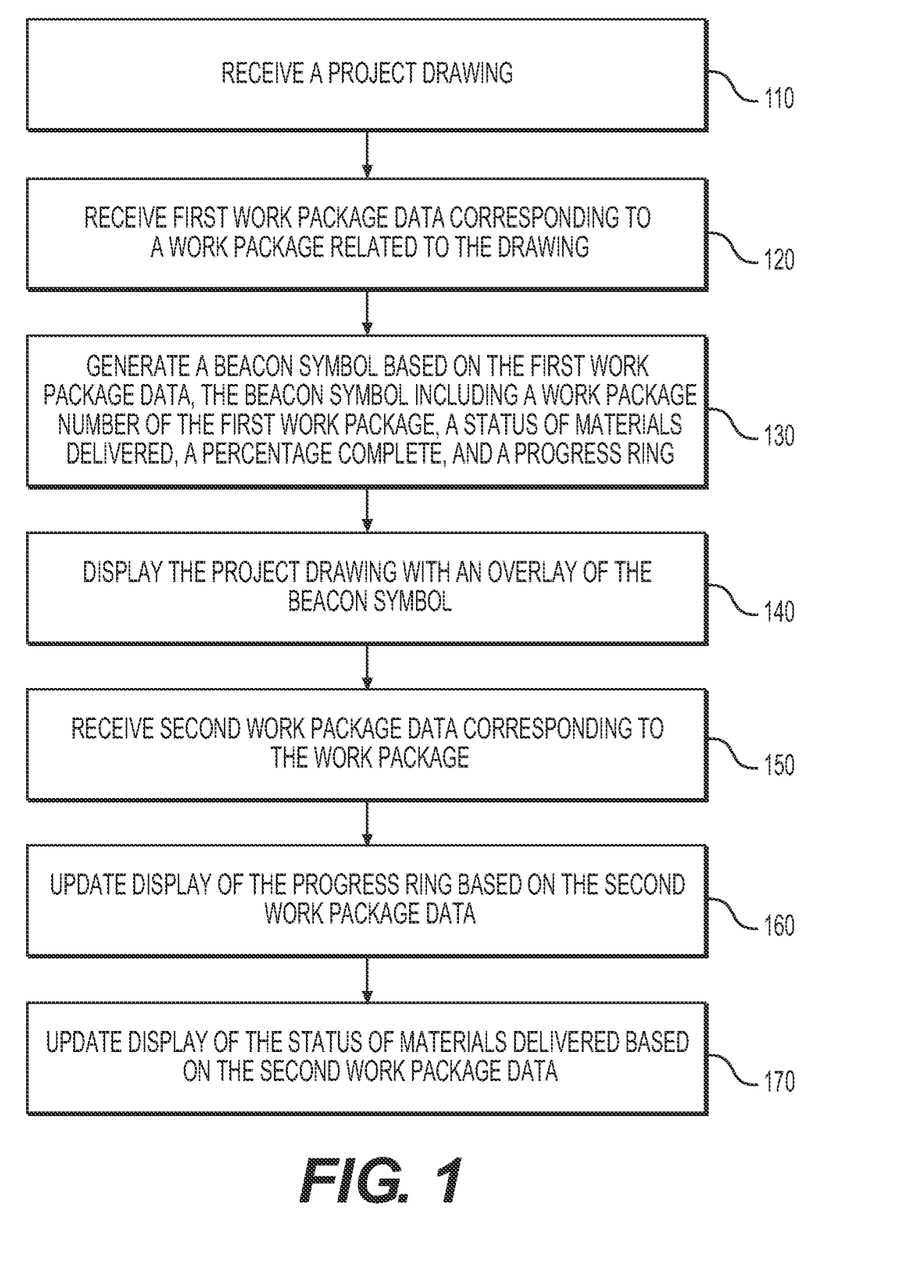
FIG. 1 illustrates an example method for providing a labor tracking beacon in CAD.

FIG. 1 illustrates an example method for providing a labor tracking beacon in CAD. At stage 110, a server can receive a project drawing. For example, a user can upload the drawing at an estimator GUI. In one example, the GUI can be generated by the server. While a server example is explained, a web server is not required in all examples. Instead, the system can operate based on an application executing on a computing device operated by the user, in an example.

The drawing can be any file type that includes a graphical representation of a construction or building plan. Example file types include PDF, DWG, and TIFF files. In one example, a file containing vectors representing building structure is used. The drawing can be two-dimensional or three-dimensional in nature.

At stage 120, the server can receive first work package data corresponding to a work package related to the drawing. A work package data can include activities or tasks required to produce a deliverable or complete a milestone in the project build. For example, the work package data can include general information about the project, materials information, and labor information. General information about the project can include items like a work package ID number, work package name, scope of work, assumptions, start date, finish date, duration, percentage complete, location, drawing number, project status, and so forth. Materials information can include information related to material involved in the project, like budgeted materials cost, actual material cost, remaining materials cost, how far over or under budget materials costs are, and materials cost codes. Labor information can include information related to labor hours performed in the project, such as budgeted labor hours, actual labor hours performed, remaining labor hours, how far over or under budget labor hours are, and labor hours codes.

In an example, the first work package data can include general information about the project and budget-related information about the materials and labor. Subsequent work package data received about the project can include actual materials costs and labor hours for the project.

In one example, the user can input the first work package data into the GUI. For example, the user can provide the general information, materials budget, and labor budget. This can include entering kits that need to be ordered and the number of hours to budget for work associated with the work package.

In another example, the server can analyze the drawing to determine materials and labor budgets needed to complete the project in the drawing. For example, the server can include a specification filter ("spec filter") that can analyze the project drawing to determine common structures, such as electrical outlets or other assemblies. The spec filter can insert symbols into the drawing. In one example, the spec filter can do this automatically by recognizing nomenclature in the drawing. In another example, the user can identify a symbol in the drawing as a particular assembly, and the spec filter can identify like symbols as the same assembly type.

The symbols can represent assemblies associated with a vendor in an example. The spec filter can access data from a vendor database that identifies the relevant assemblies in one example. The spec filter can add a symbol layer to the drawing that contains metadata identifying each symbol. The metadata can allow the system to identify the correct vendor assemblies. In one example, the system adds the symbol layer by accessing BIM software, such as REVIT, via a plugin. The metadata can include information about the assemblies or kitting.

The GUI can display the drawing with a symbol overlay. The symbol overlay can visually indicate which elements are associated with which symbols (e.g., component types). The user can continue to change or assign symbols if any are not already fully allocated correctly by the spec filter. In one example, the symbol overlay is generated by a plugin that interfaces with a CAD program. Alternatively, it can be part of the spec filter or a stand-alone web application.

Next, the system can determine the kits that will be needed based on the metadata or symbols in the symbol layer. The server can then select the appropriate assembly kits based on information provided by the user to narrow the applicable kits. For example, the user can set up a profile for their project before or after scanning the drawing. The profile can indicate one or more applicable vendors. It can also indicate a building code jurisdiction, which can be associated with particular building codes that dictate part sizes, materials, and other relevant assembly attributes. Based on the profile information, the server can determine which kits apply to the various symbols in the drawing. This can be done by querying one or more vendor databases to determine the applicable kits based on the symbol layer metadata.

At stage 130, the server can generate a beacon symbol based on the first work package data, the beacon symbol including a work package number of the first work package, a status of materials delivered, a percentage complete, and a progress ring. A construction project can include numerous work packages. Displaying the work package number on the beacon can distinguish it from other work packages. For example, the project drawing can display a portion of the project that includes multiple work packages, and the server can create a beacon symbol for each one. The work package number can distinguish one work package from another. For example, a first beacon can display "1.1.1" for a first work package and a second beacon can display "1.1.2" for a second work package.

In an example, the materials status on the beacon symbol can graphically illustrate the percentage of materials for the work package that have been delivered to the job site. For example, the beacon symbol can include a progress circle or doughnut chart that illustrates the percentage of materials delivered. In one example, the work package number can overlay the progress circle chart representing the status of materials delivered.

In an example, the percentage complete and progress ring can illustrate the progress of completing the work package. For example, the beacon symbol can include a number indicating a percentage of work completed. In one example, the percentage complete number can superimpose the status of material delivered portion of the beacon symbol. In an example, the progress ring can be a progress circle of doughnut chart that graphically illustrates the percentage complete. In one example, the job completion portion can be a circle progress chart and the progress ring can be a progress doughnut chart that encircles the status of materials complete chart. In another example, the progress ring can be a progress circle chart encircled by a progress doughnut chart representing the status of materials delivered. In one example, the progress ring can portray report labor hours as a percentage of the budgeted labor hours.

At stage 140, the server can display the project drawing with an overlay of the beacon symbol. The server can display the project drawing with the beacon symbol overlay in a GUI, for example. The project drawing can include multiple beacon symbols where more than one work package is represented in the drawing. In one example, the beacon symbol can be moved or dragged on the project drawing. For example, if the user wants to look at a part of the project drawing that is covered by the beacon symbol, the user can select the beacon symbol and drag it to another location on the drawing.

In one example, the user can define the areas on the project drawing associated with each work package. For example, the user can select a first portion of the project drawing and indicate that it corresponds to work package "1.1.1," and select a second portion and indicate that it corresponds to work package "1.1.2." The server can display each beacon symbol so that it overlays its corresponding area of the project drawing.

At stage 150, the server can receive second work package data corresponding to the work package. In an example, the second work package data can include updated information about the work package, such as the status of materials delivered, labor hours recorded, and so on. The second work package data can also include general information, such as the work package ID number, that the server can use to identify which work package the second work package data corresponds to.

The server can receive the second work package data as a single data file or as multiple data files over a period of time. The second work package data can come from the same or different sources. For example, components, assemblies, and kits shipped to the work site can include an ID, such as a unique number or a bar code, that the server can recognize. Someone on site, such as the foreman, can scan the bar code or enter the ID information into a GUI for materials that arrive. In one example, the user on site can have a list of materials in a GUI that he or she can check off when the materials arrive. The server can receive the identifying information and use it to identify the associated materials.

Labor hours can also be tracked manually or electronically. For example, an administrative user ("admin user") such as a work site foreman can enter in work hours of employees into a GUI, and the server can determine the total hours worked. In another example, employees can clock in and out using a GUI, and the server can automatically determine total hours worked and other details about the labor hours, such as which employees worked which site on which day. In one example, employees can have an ID associated with a specific type of job, such as laying concrete, electrical, and installing framework. This can be used to track how long each type of job takes. The server can also track stops and starts for work related to the work package.

In an example, the server can verify the accuracy of the estimating material dollars versus actual and labor hours estimated versus performed. In one example, the server can determine the percentage of the work of the work package that has been completed, and the server can compare this to the percentage of the estimated labor hours that have already been performed. This comparison can indicate how far under or over budget the project is regarding labor. In an example, the server can compare estimated and actual purchased material items, quantities, and costs to determine the differences between estimated versus actual. This comparison can validate the estimate or indicate inaccuracies and defects.

In an example, the second work package data can include additional information about the project build that can affect materials or labor costs. The server can perform logistics related to the actual build of the project using the second work package data. For example, the second work package data can include information about crew sizes, material storage layouts, how materials are marked, housekeeping practices, continuity or momentum issues created by crews being assigned to different locations, work between crews interfering with each other, sequencing or control of work being done, and the timeliness of deliveries. These causes exist in varying degrees on all construction projects. Many of them are subtle and appear gradually over time, and some exist but are never noticed. Often, by the time they are noticed, the damage has already been done.

At stage 160, the server can update display of the progress ring based on the second work package data. In one example, a user at the work site can update the progress ring. For example, the foreman of the work site can be tasked with determining the work completed to date and updating the progress ring accordingly. In an example, the foreman can have access to a GUI where he or she can provide this information. In one example, this can be as simple as the foreman entering a number in a field that represents the percentage completed.

In an example, the server can update the beacon symbol of the work package according to the updated work progress information. For example, the server can change the percentage complete number to display the percentage of work completed. The server can also update the progress ring by filling or coloring a portion of a progress doughnut chart corresponding to the indicated percentage complete.

At stage 160, the server can update display of the materials status based on the second work package data. For example, when materials arrive at the job site and a user reports their arrival, the server can update the portion of the beacon symbol corresponding to the materials status. In one example, materials can have an associated weight that reflects their percentage of the total materials cost. When the server receives an indication of materials being delivered, the server can determine the ratio of the total cost of materials delivered to date versus the total estimated cost of all the materials. The server can then adjust the portion of the beacon symbol to reflect this ratio. As an example, the materials status can be displayed as a progress circle chart, and the server can shade or color a portion of the chart corresponding to the percentage of materials received based on cost.

Figure 2:
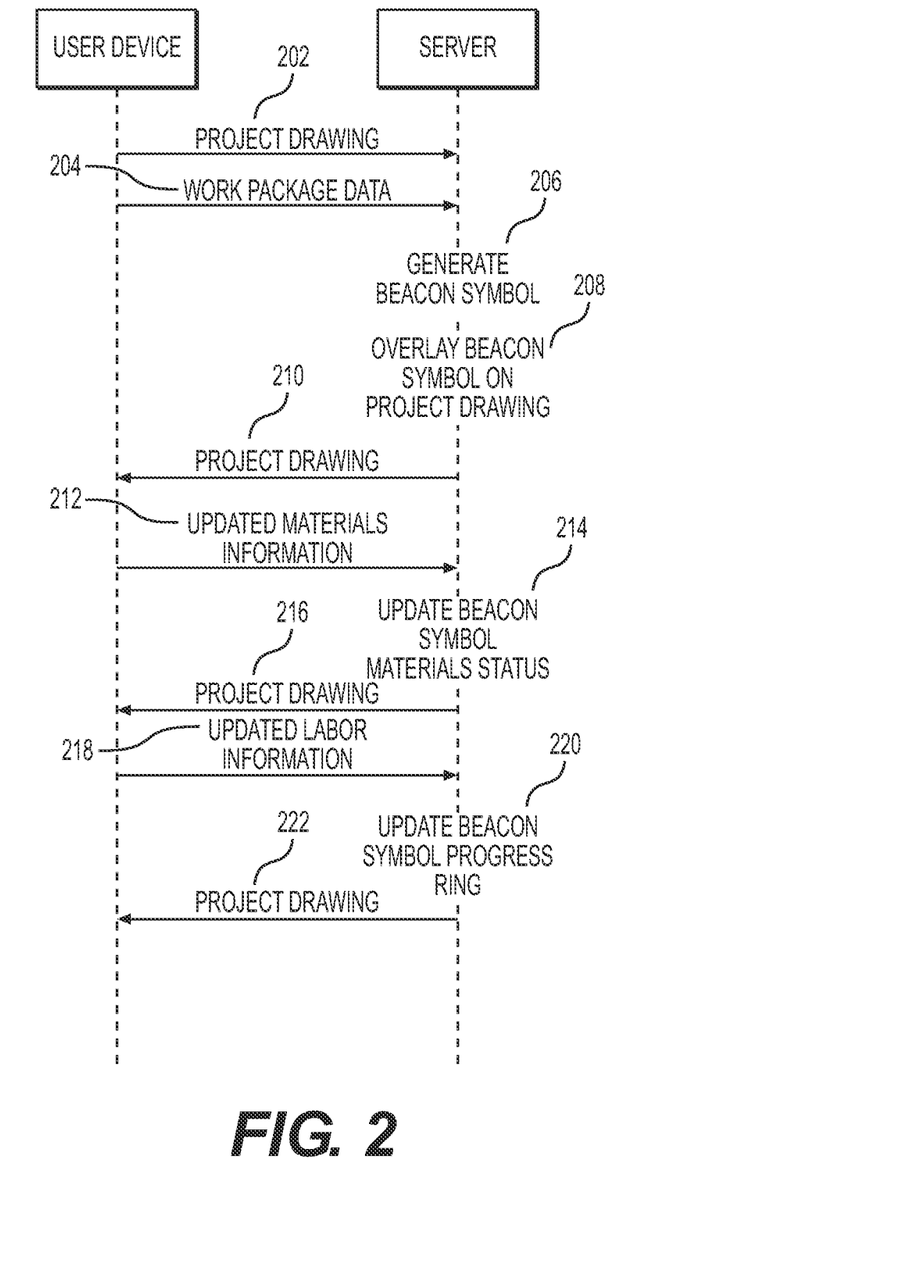
FIG. 2 illustrates an example sequence diagram for providing a labor tracking beacon in CAD.

FIG. 2 illustrates an example sequence diagram for providing a labor tracking beacon in CAD. At stage 202, a user device can send a project drawing to a server. For example, a user can upload the drawing at an estimator GUI. In one example, the GUI can be generated by the server. While a server example is explained, a web server is not required in all examples. Instead, the system can operate based on an application executing on the user device operated by the user, in an example.

The drawing can be any file type that includes a graphical representation of a construction or building plan. Example file types include PDF, DWG, and TIFF files. In one example, a file containing vectors representing building structure is used. The drawing can be two-dimensional or three-dimensional in nature.

At stage 204, the user device can send first work package data to the server. The first work package data can include information about a work package, such as an ID, name, dates, job location and so forth. The work package data can also include information about materials and labor. For example, the work package data can indicate components, assemblies, and kits that need to be ordered for the job, a budget for the materials, and a budget for labor on the project. The labor hour budget can be broken down into specific tasks and subtasks, in an example.

Some or all the work package data can be provided by the user through the GUI. In one example, the server can include a spec filter that can analyze the drawing to determine materials and labor budgets needed to complete the project in the drawing. The user can review these budgets in the GUI and make any necessary modifications.

At stage 206, the server can generate a beacon symbol based on the work package data. The beacon symbol can graphically display information about the progress of the work package. For example, the beacon symbol can include the work package number, a progress circle graph that displays the percentage of materials that have been delivered to the job site, a number indicating the percentage of the work package job that has been completed, and a progress doughnut ring around the materials status circle that graphically displays the job progress.

At stage 208, the server can overlay the beacon symbol on the project drawing. In one example, the beacon can be positioned over a portion of the drawing corresponding to the work package. For example, the project drawing can display portions of multiple work packages. The user can indicate, using the GUI, which portion of the drawing corresponds to which work package. The server can position each beacon symbol on or next two their corresponding portion.

At stage 210, the server can send the project drawing with the overlayed beacon symbol to the user device. For example, the server can be a web server. The user can log into a web application on the web server, which can cause the server to send a hypertext markup language ("HTML") file to the user device with the GUI. The GUI can include the project drawing with the overlayed beacon symbol. In an alternate example, the user can use an application on the user device, and the server can send the GUI with the drawing and beacon symbol using an Application Programming Interface ("API") call.

At stage 212, the user device can send updated work project data with new materials information to the server. The updated work project data can come from the same or a different user device, depending on the example. For example, a user at the job site can confirm receipt of materials shipments using a user device at that location. In an example, the server can provide a GUI to a user at the job site that allows the on-site user to indicate when materials arrive.

At stage 214, the server can update the beacon symbol based on the updated materials information. As an example, the server can determine the cost of materials received at the job site to date and determine what percentage of materials have arrived based on their total cost. The server can then update the progress circle chart on the corresponding beacon symbol to reflect that percentage. In one example, the server can also display the number percentage on the beacon symbol. At stage 216, the server can send the project drawing with the updated overlayed beacon symbol to the user device. For example, the server can update the beacon symbol in real time as it receives the materials delivery information. This can include sending an update file with change.

In one example, where the materials cost exceeds the budget, the beacon symbol can perform an action to draw a user's attention. For example, the materials status portion of the beacon symbol can flash, pulse, or change color when the budget is exceeded.

At stage 218, the user device can send updated work project data with new labor information to the server. Like stage 212 above, the user device here can be the same or a different user device. For example, one user device can provide information for generating the beacon symbol, a second user device can provide materials updates, and a third user device can provide updated labor information.

The labor information can indicate hours worked by employees at the job site. The labor information can be sent automatically when the employees clock in and out using an electronic time tracking system. In one example, a single user, such as the foreman of the job, can input this information into a GUI on the user device.

At stage 220, the server can the server can update the beacon symbol based on the updated labor information. In an example, the server can determine the total hours worked and compare it to the budgeted labor hours. The server can determine the percentage of budgeted hours that have been completed and update the beacon symbol accordingly. For example, the server can update the percentage complete number and the progress ring to graphically display that percentage. At stage 222, the server can the server can send the project drawing with the updated overlayed beacon symbol to the user device. For example, the server can update the beacon symbol in real time as it receives the materials delivery information. This can include sending an update file with change.

In one example, where the labor hours performed exceeds the budget, the beacon symbol can perform an action to draw a user's attention. For example, the labor hours portion of the beacon symbol can flash, pulse, or change color when the budget is exceeded.

Figure 3A:
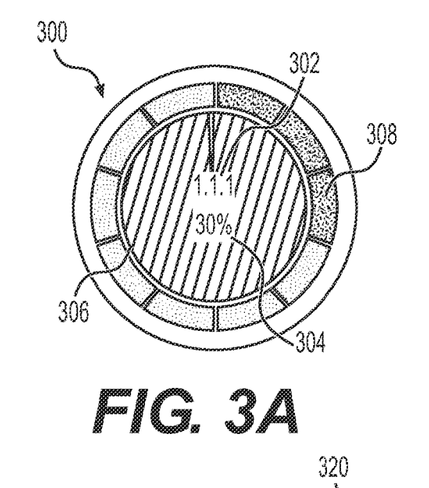
FIG. 3A illustrates an example GUI display of a labor tracking beacon.

FIG. 3A illustrates an example GUI 300 of a work package beacon. The GUI 300 includes the work package ID 302 of the work package, which in this example is "1.1.1." Below the work package ID 302, the GUI 300 displays the percentage complete 304 of the work package job. This percentage is graphically illustrated in a progress ring 308. The progress ring 308 is a progress doughnut graph that displays the job progress. As shown, the percentage complete 304 shows 30% of the job has been completed, and 30% of the progress ring is filled in. The GUI 300 also include a materials status graph 306 that indicates the percentage of materials that have been delivered. In this example, the materials status graph 306 appears as a solid circle because all the materials have been delivered for work package 1.1.1. In an example, the materials status graph 306 and progress ring 308 can flash, pulse, or change color when the materials costs or reported labor hours exceed their respective budgets.

Figure 3B:
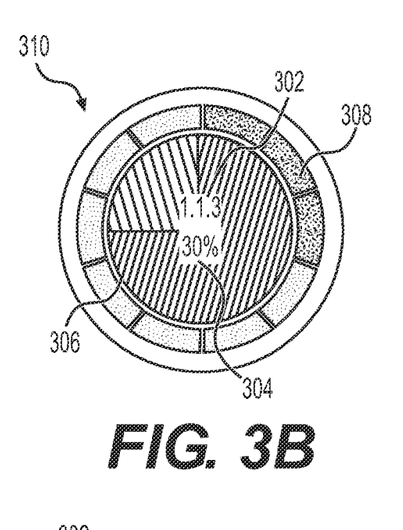
FIG. 3B illustrates a second example GUI display of a labor tracking beacon.

FIG. 3B illustrates a second example GUI 310 of a work package beacon. The GUI 310 illustrates a beacon for a work package that begun work before all the materials have been delivered. For example, the materials status graph 306 indicates that about 75% of the materials have been delivered, but the percentage complete 304 and progress ring 308 indicate that 30% of the job has been completed. Beginning work before all the materials arrive can cause complications, delays, and other problems on a job site. In an example, the materials status graph 306 can give an alarm when work is reported before all the materials are reported to have arrived, such as with a flash, pulse, or change of color. This can help a user recognize that some investigation may be needed on the work package. In one example, the user can interact with the beacon to disable any alarm. For example, the user can select the GUI 310, or specifically the portion of the GUI 310 giving the alarm, and the GUI can present options for the user, including disabling the alarm.

Figure 3C:
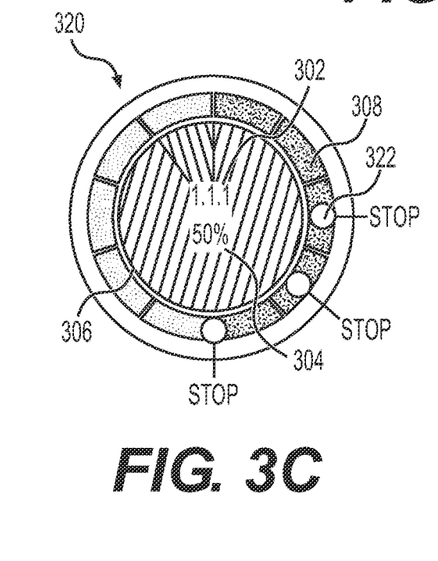
FIG. 3C illustrates a third example GUI display of a labor tracking beacon.

FIG. 3C illustrates a third example GUI 320 of a work package beacon. The GUI 320 illustrates a beacon for a work package where work began before all the materials arrived, and there have been disruptions in the work. The materials status graph 306 in GUI 320 indicates that about 90% of the materials have arrived and the percentage complete 304 and progress ring 308 indicate that 50% of the work has been completed. The GUI 320 includes stop indicators 322 that indicate at what point during the job construction that the stop occurred. In one example, selecting a stop indicator 322 can cause a window to appear with information about the stoppage.

Figure 4:
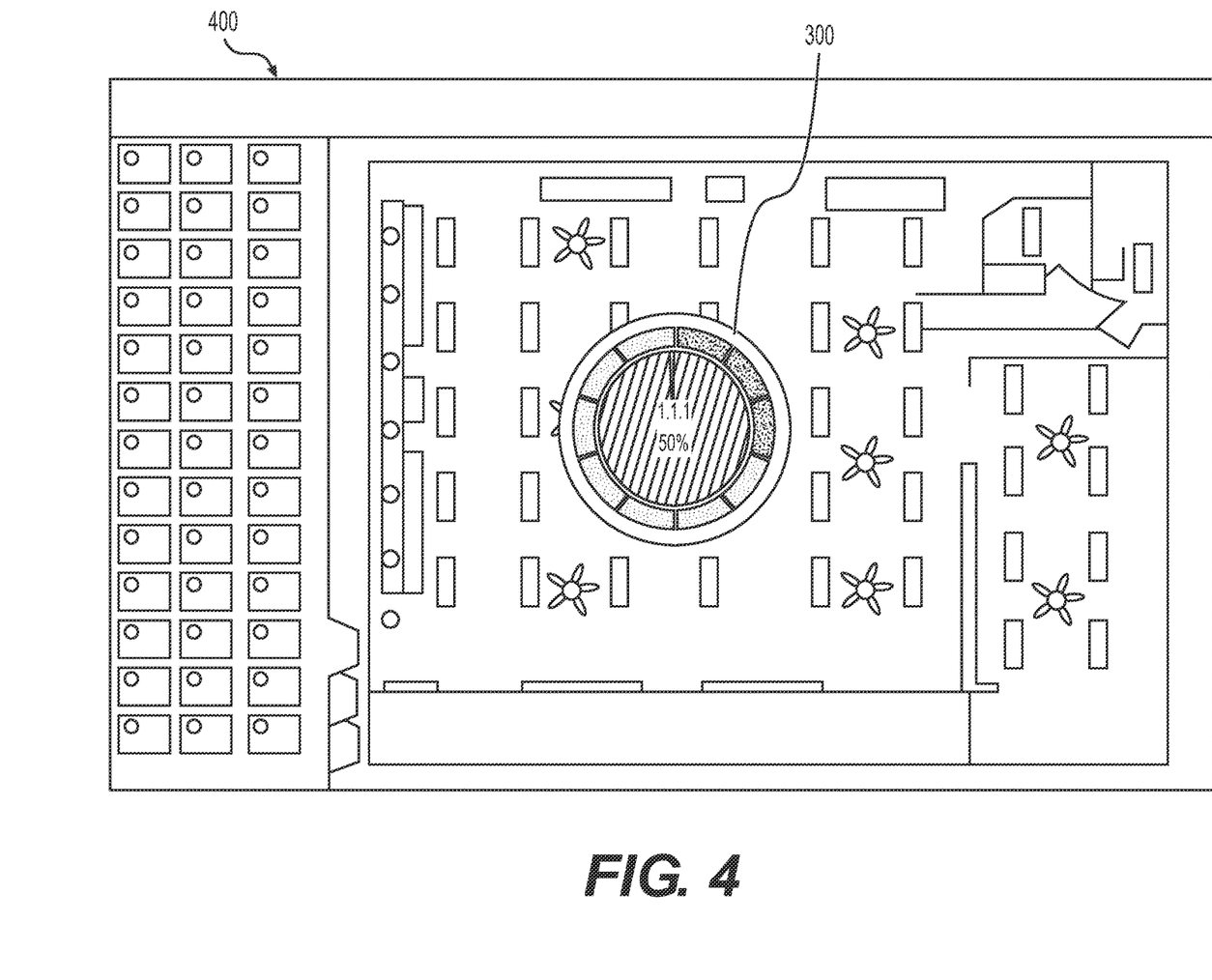
FIG. 4 illustrates an example GUI display of a project drawing with a labor tracking beacon overlay.

FIG. 4 illustrates an example GUI display of a project drawing 400 with an overlayed work package beacon GUI 300. Although GUI 300 is displayed, the overlayed work package beacon can be any such GUI, like GUIs 310 and 320. In an example, the project drawing can be a drawing uploaded by a user. In this example, work package of the GUI 300 corresponds to the entire drawing 400. However, the drawing 400 can include multiple work package beacon GUIs 300 where multiple work packages are represented in the drawing 400. The user can select an area of the drawing and assign it to a corresponding work package beacon GUI 300.

Figure 5:
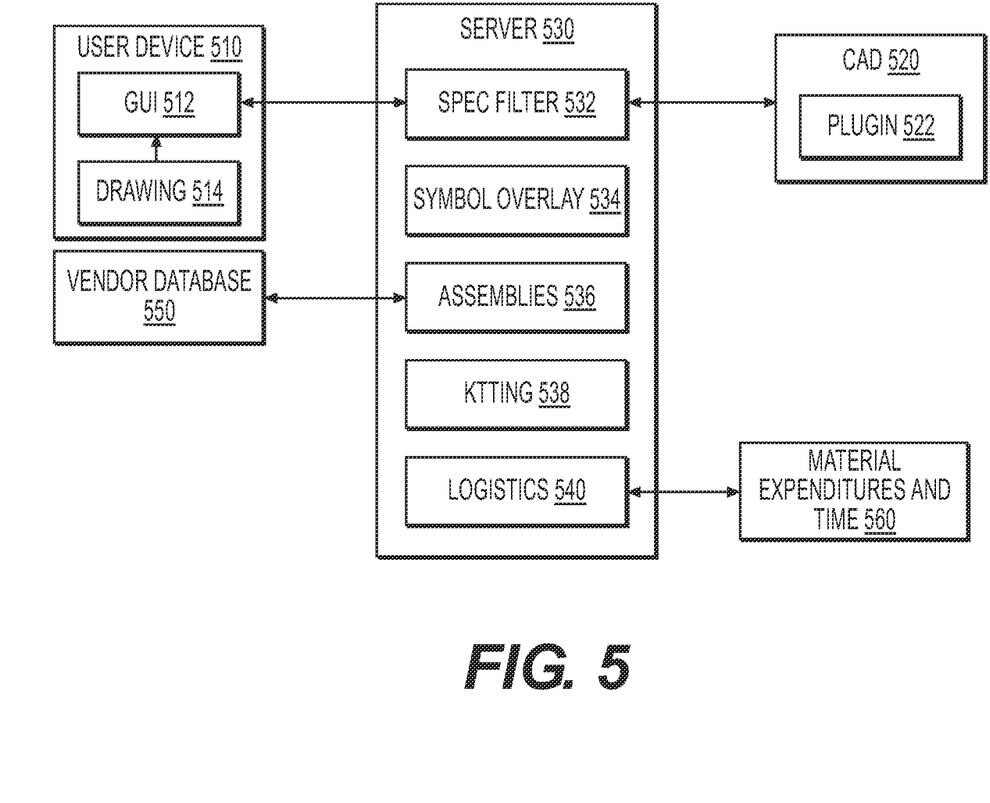
FIG. 5 is an exemplary illustration of system components for providing a labor tracking beacon in CAD.

FIG. 5 includes an exemplary diagram of a system for tracking a work package in accordance with an example. A user device 510 can be used to supply a drawing 514 to a spec filter 532 on a server 530. The user device 510 can be one or more processor-based devices, such as a personal computer, tablet, or cell phone. It can also include or be part of a server in one example. The user device 510 can execute REVIT or another CAD 520 application, in one example, by executing a set of instructions stored locally or remotely on a computer-readable medium. In another example, the spec filter 515 can execute locally on the user device 510.

The drawing 514 can be any file type that includes a graphical representation of a construction or building plan. Example file types include PDF, DWG, and TIFF files. In one example, a file containing vectors representing building structure is used. The drawing 514 can be two-dimensional or three-dimensional in nature.

In one example, the spec filter 532 can be an application that executes on a computing device, such as user device 510 or server 530. In one example, the server 530 can be a web server that the user device 510 accesses over the internet. The server 530 can be a single server or a group of servers, including multiple servers implemented virtually across multiple computing platforms. It can be hosted on the cloud, in one example.

The spec filter 532 provide a GUI 512 that allows the user to upload or open the drawing 514 from user device 510. In one example, the GUI 512 can allow the user to link a first element in the drawing 514 to an assembly type. For example, a first element in the drawing 514 could indicate an electrical outlet. A second element can indicate conduit. A third element can indicate a ceiling fan. The user can identify these assembly types, in one example, by clicking on or otherwise capturing or indicating an element, and then selecting an element type from a drop-down list or other selection component. Then, the spec filter 532 can recognize similar elements and automatically assign the corresponding assembly types to those elements. In still another example, the spec filter 532 can recognize standard symbols in the drawing 514.

The spec filter 532 can also add symbols to an overlay 534 on the drawing 514. The symbol overlay 534 can indicate which symbols (component types) correspond to which elements in the drawing 514. A panel of symbols can allow the user to easily select different symbol types and apply them to the drawing 514. For example, the user can select a first symbol, and then apply it to the drawing by clicking a various locations on the symbol overlay 534 (over the drawing 514).

The symbol overlay 534 can include a beacon symbol that gets placed on project plans to create a visual representation of the WBS work package, material status, and percentage complete. In one example, the drawing 514 can include areas for multiple WBS work packages. The spec filter 532 can add a beacon symbol overlay 534 for each WBS work package represented. In one example, the user can indicate what portions of the drawing 514 correspond to which beacon symbol overlay 534. The spec filter 532 can place the beacon symbol overlay over its corresponding area of the drawing 514.

The symbol overlay 538 can also include metadata that describes the component types or allows the system to identify the particular components, kits, and assemblies. The metadata can indicate the location of a particular assembly type. This metadata can be accessed by the server 530 or in a CAD 520 program, such as REVIT, to determine assemblies 536 that correspond to the symbols.

In one example, the system can select assemblies 536 that correspond to the assembly types and meet user-identified criteria. For example, the user-identified criteria and metadata indicating an assembly type can be compared to components, assemblies, and kits in a vendor database 550. The vendor database 550 can be removed from the server 530 or can be part of or local to the server 530. The vendor database 550 can be accessed by a plugin 522 executing in REVIT in one example.

An example metadata can be formatted as follows:
Name: Lighting Panelboard—208V MLO
Type: [Panelboard]
Voltage: 208
Dimensions: Width 5'8"; Depth 0'5¾"
Mains: 100.00 A The user-identified criteria can influence things like wire gauge. It can also influence or specify which kitting 538 applies to which assembly 536. More or less kitting 538 might be desired, depending on the user.

In one example, the server 530 can send the drawing 514 with symbol overlay 534 to REVIT or another CAD 520 program. Using a plugin 532 that includes API commands, the server 530 can send the drawing 514 to CAD 520 and cause the CAD 520 program to model the floorplan with vendor assemblies 536. This can allow the user to visualize the floorplan with assemblies 536 in place that meet the user-identified criteria.

The CAD 520 program can also output a list of materials and assemblies back to the server 530 for transformation into a bill of materials. The bill of materials can include kits and assemblies from multiple vendors. The server 530 can group the components by vendor to send individual purchase orders to each vendor, once the user approves. The bill of materials can include labor rates, which can be part of the metadata associated with the symbols. Kits can also be represented in the bill of materials based on the metadata.

In one example, the server 530 can have a web interface with vendors for placing orders with the vendors (i.e., suppliers). The orders can include part numbers, pricing, and kitting, based on the metadata being linked to the vendor parts based on the user-identified criteria. Shipping and delivery information can be embedded into the order, allowing each vendor to simply fill the order without additional complication.

The assemblies 536 can be built using one or more kits 538, in an example. The vendor database 550 can indicate which kits 538 correspond to which assemblies 536. The kits can include packages of parts for on-site assembly in one example. The assembly order can further be specified by the vendor database 550.

A logistics component 540 can execute at the server 530 or on a remote vendor server for scheduling shipments. The logistics component 540 can also group components by vendor so that multiple purchase orders are generated based on the number of vendors.

The logistics component 540 can track expenditures to compare against the kits in an area as part of updating beacon symbols 534. For example, the logistics component can compare expenditures on materials and compare them to a budget for material. The logistics component can update, or alternatively provide data to the spec filter 532 for updating, the beacon symbol. The beacon symbol 534 can display the percentage of the materials budget that has been spent to date. If the materials expenditures exceed the budget, the portion of the beacon symbol 534 corresponding to the materials can flash, pulse, or change colors to indicate such.

In an example, the logistics component 540 can track reported labor hours and compare them to the budget labor hours. The logistics component 540 can determine a percentage of the budgeted labor hours that have been performed, and this can be displayed in a beacon overlay 534. For example, the logistics component 540 can provide this information to the spec filter 532, which can in turn update the symbol overlay 534. If the reported labor hours exceed the budget, the portion of the beacon symbol 534 corresponding to the labor hours can flash, pulse, or change colors to indicate such.

The logistics component 540 can stagger shipping in one example, based on kit 538 assembly time. In another example, assembly types themselves are staggered. For example, an electrical junction box would be installed in a project before a ceiling fan. Therefore, the logistics component 540 can schedule shipment of the electrical junction box two months ahead of the ceiling fan.

The server 530 can also provide a GUI 512 for entering user-identified criteria. This can include one or more selected vendors, building codes, or material types. In this way, the user can narrow the field of possible assemblies, kits, and components that will be used in the project.

In one example, a vendor database 550 can store the custom components. The custom components can include parameters used to ensure the sizing is accurate and that the components are directly usable for fabrication. Alternatively, the vendor database 550 can simply identify the components (e.g., assemblies) in a way that the vendor recognizes. The database 550 can be implemented by any type of computing device. In one example, the database 550 is part of user device 510. In another example, the database 550 is remotely accessible by the user device 510, such as over a network. The network can be a local area network, an enterprise network, or the Internet. In one example, multiple user devices 510 in an enterprise can remotely access the vendor database 550 over a network.

Using the API, REVIT 520 can execute custom methods for the plugin 522 when certain events occur within REVIT 520. Events are generated when an action is submitted to a REVIT 520 server for performance by REVIT 520. The plugin 522 can implement the events to cause REVIT 520 to communicate with the plugin 522. The plugin 522 then can execute custom methods for customized functionality.

Other embodiments of the invention will be apparent to those skilled in the art from consideration of the specification and practice of the invention disclosed herein. It is understood that the examples can operate as an application or plugin with REVIT or any other BIM or CAD program. Also, the terms part, component, and assembly are used interchangeably. It is intended that the specification and examples be considered as exemplary only, with a true scope and spirit of the invention being indicated by the following claims.

What is claimed is:

1. A system for tracking a work package using beacons in computer-aided design ("CAD"), comprising:
    a memory storage including a non-transitory, computer-readable medium comprising instructions; and
    a computing device including a hardware-based processor that executes the instructions to carry out stages comprising:
        receiving first work package data corresponding to a work package related to a portion of a building plan;
        generating a beacon symbol based on the first work package data, wherein the beacon symbol includes a work package number of the work package, a material status graph of materials delivered, a percentage complete, and a progress ring that graphs progress of completing the work package, wherein the material status graph is circular and positioned inside the progress ring;
        displaying the building plan with an overlay of the beacon symbol;
        receiving second work package data corresponding to the work package;
        updating display of the progress ring based on the second work package data, including filling a portion of the progress ring to indicate an increased completion percentage; and
        updating display of the status of materials delivered based on the second work package data,
        wherein the progress ring indicates at least one work stoppage at a point along the ring that corresponds to the work completion percentage when the work stoppage occurred.

2. The system of claim 1, wherein the first work package data includes budgeted labor hour limits and the second work package data includes actual labor hours performed, and updating display of the progress ring comprises:

comparing the actual labor hours performed versus the labor hour limits; and shading a portion of the performance ring based on a percentage of the amount of actual labor hours performed to the labor hour limits.

3. The system of claim 2, the stages further comprising updating the percentage complete to display the percentage of the amount of actual labor hours performed to the labor hour limits.

4. The system of claim 2, wherein the progress ring flashes, pulses, or changes color when the actual labor hours performed exceeds the budgeted labor hour limits.

5. The system of claim 1, wherein the first work package data includes material requisitions of the work package and the second work package data includes materials delivered for the work package, and updating display of the status of materials comprises:

comparing the materials delivered versus the material requisitions;

shading a portion of the status of materials delivered in the beacon symbol based on a percentage of the amount of materials delivered to the material requisitions.

6. The system of claim 5, wherein the material requisitions are determined based on expenditures, and wherein the expenditures are compared to a total cost of the work package.

7. The system of claim 1, wherein a work package schedule specifies order of completion of the work package relative to other work packages, and wherein the schedule is used to allocate a portion of total hours and material costs to the work package.

8. A method for tracking a work package using beacons in computer-aided design ("CAD"), comprising:

receiving first work package data corresponding to a work package related to a portion of a building plan;

generating a beacon symbol based on the first work package data, wherein the beacon symbol includes a work package number of the work package, a material status graph of materials delivered, a percentage complete, and a progress ring that graphs progress of completing the work package, wherein the material status graph is circular and positioned inside the progress ring;

displaying the building plan with an overlay of the beacon symbol;

receiving second work package data corresponding to the work package;

updating display of the progress ring based on the second work package data, including filing a portion of the progress ring to indicate an increased completion percentage; and updating display of the status of materials delivered based on the second work package data, wherein the progress ring indicates at least one work stoppage at a point along the ring that corresponds to the work completion percentage when the work stoppage occurred.

9. The method of claim 8, wherein the first work package data includes budgeted labor hour limits and the second work package data includes actual labor hours performed, and updating display of the progress ring comprises:

comparing the actual labor hours performed versus the labor hour limits; and shading a portion of the performance ring based on a percentage of the amount of actual labor hours performed to the labor hour limits.

10. The method of claim 9, the stages further comprising updating the percentage complete to display the percentage of the amount of actual labor hours performed to the labor hour limits.

11. The method of claim 9, wherein the progress ring flashes, pulses, or changes color when the actual labor hours performed exceeds the budgeted labor hour limits.

12. The method of claim 8, wherein the first work package data includes material requisitions of the work package and the second work package data includes materials delivered for the work package, and updating display of the status of materials comprises:

comparing the materials delivered versus the material requisitions;

shading a portion of the status of materials delivered in the beacon symbol based on a percentage of the amount of materials delivered to the material requisitions.

13. The method of claim 12, wherein the material requisitions are determined based on expenditures, and wherein the expenditures are compared to a total cost of the work package.

14. The method of claim 8, wherein a work package schedule specifies order of completion of the work package relative to other work packages, and wherein the schedule is used to allocate a portion of total hours and material costs to the work package.

15. A non-transitory, computer-readable medium containing instructions that, when executed by a hardware-based processor, performs stages for tracking a work package using beacons in computer-aided design ("CAD"), the stages comprising:

receiving first work package data corresponding to a work package related to a portion of a building plan;

generating a beacon symbol based on the first work package data, wherein the beacon symbol includes a work package number of the work package, a material status graph of materials delivered, a percentage complete, and a progress ring that graphs progress of completing the work package, wherein the material status graph is circular and positioned inside the progress ring;

displaying the building plan with an overlay of the beacon symbol;

receiving second work package data corresponding to the work package;

updating display of the progress ring based on the second work package data, including filing a portion of the progress ring to indicate an increased completion percentage; and updating display of the status of materials delivered based on the second work package data, wherein the progress ring indicates at least one work stoppage at a point along the ring that corresponds to the work completion percentage when the work stoppage occurred.

16. The non-transitory, computer-readable medium of claim 15, wherein the first work package data includes budgeted labor hour limits and the second work package data includes actual labor hours performed, and updating display of the progress ring comprises:

comparing the actual labor hours performed versus the labor hour limits; and shading a portion of the performance ring based on a percentage of the amount of actual labor hours performed to the labor hour limits.

17. The non-transitory, computer-readable medium of claim 16, the stages further comprising updating the percentage complete to display the percentage of the amount of actual labor hours performed to the labor hour limits.

18. The non-transitory, computer-readable medium of claim 16, wherein the progress ring flashes, pulses, or changes color when the actual labor hours performed exceeds the budgeted labor hour limits.

19. The non-transitory, computer-readable medium of claim 15, wherein the first work package data includes material requisitions of the work package and the second work package data includes materials delivered for the work package, and updating display of the status of materials comprises:
   comparing the materials delivered versus the material requisitions;
   shading a portion of the status of materials delivered in the beacon symbol based on a percentage of the amount of materials delivered to the material requisitions.

20. The non-transitory, computer-readable medium of claim 19, wherein the material requisitions are determined based on expenditures, and wherein the expenditures are compared to a total cost of the work package.

\* \* \* \* \*